United States Patent

Oudoire et al.

[11] Patent Number: 5,939,667
[45] Date of Patent: Aug. 17, 1999

[54] SUBSEA THERMOELECTRIC GENERATOR WITH THERMOELECTRIC MODULES DISPOSED IN SLEEVES

[75] Inventors: Philippe Oudoire, Les Pieux; Gery Tribou, Equeurdreville/Hainneville; Tony Mesnil, Tourlaville; Gerard Burnouf, Equeurdreville/Hainnevile; Philippe Dubourdieu, Cherbourg, all of France

[73] Assignee: L'Etat Francais represente par le Delegue General pour l'Armement, Paris, France

[21] Appl. No.: 08/998,709

[22] Filed: Dec. 29, 1997

[30] Foreign Application Priority Data

Dec. 26, 1996 [FR] France .................... 96 16032

[51] Int. Cl.⁶ .................... H01L 35/30
[52] U.S. Cl. .................... 136/205; 136/208; 136/212; 136/232
[58] Field of Search .................... 136/201, 203, 136/205, 208, 212, 230, 232

[56] References Cited

U.S. PATENT DOCUMENTS

| | | | |
|---|---|---|---|
| 3,830,664 | 8/1974 | Winkler et al. | 136/202 |
| 4,056,406 | 11/1977 | Markman et al. | 136/208 |
| 4,095,998 | 6/1978 | Hanson | 136/208 |
| 4,633,029 | 12/1986 | Tillett, Jr. et al. | 136/205 |
| 5,228,923 | 7/1993 | Hed | 136/208 |

FOREIGN PATENT DOCUMENTS

| | | |
|---|---|---|
| 2 475 759 | 8/1981 | France . |
| 2 140 206 | 11/1984 | United Kingdom . |
| WO 88 05964 | 8/1988 | WIPO . |
| WO 91 11029 | 7/1991 | WIPO . |

OTHER PUBLICATIONS

"Subsea Thermoelectric Generators", Jean–Pierre von der Weid, et al., Sea Technology, May 1994, pp. 45–51.

"Design of a Semiconductor Thermoelectric Generator for Remote Subsea Wellheads", D.W. Auckand et al., IEEE Proc. Electr. Power Application, vol. 142, No. 2, Mar. 1995, pp. 65–69.

"Subsea Electric Generator", von der Weid, J.P., et al., Engineering in Harmony With The Ocean, Victoria, Oct. 18–21, 1993, vol. 2, pp. II–172–176.

Primary Examiner—Kathryn Gorgos
Assistant Examiner—Thomas H Parsons
Attorney, Agent, or Firm—Oliff & Berridge, PLC

[57] ABSTRACT

A subsea thermoelectric generator has a plurality of flat thermoelectric modules attached concentrically to the outside wall of an undersea line in which petroleum products extracted from a subsea drilling well circulate. The thermoelectric modules are disposed in flat-bottomed pans machined into the outside wall of the line. The pans are sealed by lids made of heat-conducting material and in thermal contact with the thermoelectric modules. Each lid defines, with the walls of the corresponding pan, a peripheral sealed chamber. The various chambers in the pans communicate with each other through passages provided in partitions that separate the pans and are filled with a soft (compliant), preferably non-heat-conducting, resin. At least one of the pans is provided with an orifice closed by a sealed deformable element.

14 Claims, 3 Drawing Sheets

SUBSEA THERMOELECTRIC GENERATOR WITH THERMOELECTRIC MODULES DISPOSED IN SLEEVES

BACKGROUND OF THE INVENTION

1. Field of Invention

The present invention relates to a subsea thermoelectric generator designed in particular for the equipment at drilling wellheads.

2. Description of Related Art

It is known that such a generator has semiconductor-type thermoelectric modules attached to a drilling line immersed in the sea water, in which line the petroleum product extracted from the well flows. This generator is capable of furnishing an electric current by the Seebeck effect due to the difference between the relatively high temperature (over 40° C.) of the petroleum product extracted and the relatively low temperature (a few degrees) of the sea water.

The article "Subsea Thermoelectric Generators" by Jean-Pierre Von der Weid et al., published in Sea Technology, May 1994, pages 45–51, discloses a thermoelectric generator based on this principle. In this generator, which has cylindrical geometry, the thermoelectric modules are made of flat elements disposed concentrically in sleeves along a drilling line and connected electrically in series or in parallel. The surfaces of these modules are applied to the outside wall of the line to favor maximum transmission of heat flow between the fluid carried and the modules.

The modules are covered with rigid plates with high thermal conductivity, made of copper for example, to ensure good heat transmission between the modules and the sea water and to protect the modules against excessive compression forces manifested in the sea bed.

The peripheral edges of these plates rest on heat-insulating shoulders that compel the heat flow to pass principally through the thermoelectric modules. A resin seal is applied to the edges of the plates to prevent water from penetrating to the module.

However, these plates can deform under the force of the considerable hydrostatic pressure prevailing on the sea floor and thus apply compression forces to the thermoelectric modules that could destroy them. Moreover, since the resin seal is directly exposed to the sea water, local corrosion may cause it to become ineffective.

The article "Design of a Semiconductor Thermoelectric Generator for Remote Subsea Wellheads" by D. W. Auckland et al., published in IEEE Proc. Electr. Power Application, Volume 142, no. 2, March 1995, pages 65–69, discloses a thermoelectric generator provided with flat thermoelectric modules disposed concentrically along the line. The modules are attached to flat-bottomed pans machined into the outside wall of the line. To prevent short circuits between the modules, the latter are separated from the line and the walls of the pans by a layer of electrically insulating material. Likewise, the gaps between the modules are filled with a heat insulator which not only forces the heat flow principally through the modules but also prevents sea water from penetrating to the modules.

This generator suffers from the same defects as the generator described above because the layers of insulating material imperfectly protect the modules from outside compression forces.

SUMMARY OF THE INVENTION

A goal of the present invention is to overcome the disadvantages of the aforementioned thermoelectric generators. Thus, the invention relates to a thermoelectric generator in which the thermoelectric modules are fully isolated from the sea water and protected from the action of the hydrostatic pressure exerted by the sea water.

For this purpose, the invention relates to a subsea thermoelectric generator of the type having a plurality of flat thermoelectric modules attached concentrically to the outside wall of a drilling line, immersed in sea water, in which a fluid extracted from a subsea drilling well circulates. The thermoelectric modules are disposed in flat-bottomed pans machined into the outside wall of the line. The pans are sealed by lids made of heat-conducting material in thermal contact with the thermoelectric modules. Each lid defines, with the walls of the corresponding pan and with the peripheral edges of the corresponding module, a peripheral sealed chamber. The various chambers in the pans communicate with each other through passages in the partitions that separate the pans and are filled with a soft non-heat-conducting resin. At least one of the pans is provided, in an area at right angles to the corresponding chamber, with an orifice closed by a sealed deformable element which allows the hydrostatic pressure of the external marine environment to be transmitted to the resin filling the chambers.

Thus, the pressure applied to the resin by the deformation of the deformable element compensates for the hydrostatic pressure applied to the lids. As a result, the lids undergo practically no deformation and apply no pressure to the thermoelectric modules.

The resin has the advantage of not leaking, in contrast to liquid fluids such as oil that are usually used to balance the pressure of an internal environment. Moreover, due to its insulating properties and its soft consistency, the resin does not transmit heat either by conduction or by convection. It hence fully insulates the two faces of the thermoelectric modules.

According to a particular embodiment of the invention, the outside wall of the line has several rectangular pans extending in the lengthwise direction around the line and separated from each other by lengthwise partitions. The lids rest by their edges on the partitions and are attached by means of rods made of insulating material that cover the contiguous lengthwise edges of the neighboring lids and which are screwed into said partitions.

Each lid is comprised of a plate having a thick central portion with a surface area substantially equal to that of a thermoelectric module and a peripheral flange that rests on the edge of the pan by means of seal holders made of heat-insulating material.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

Figure 1:
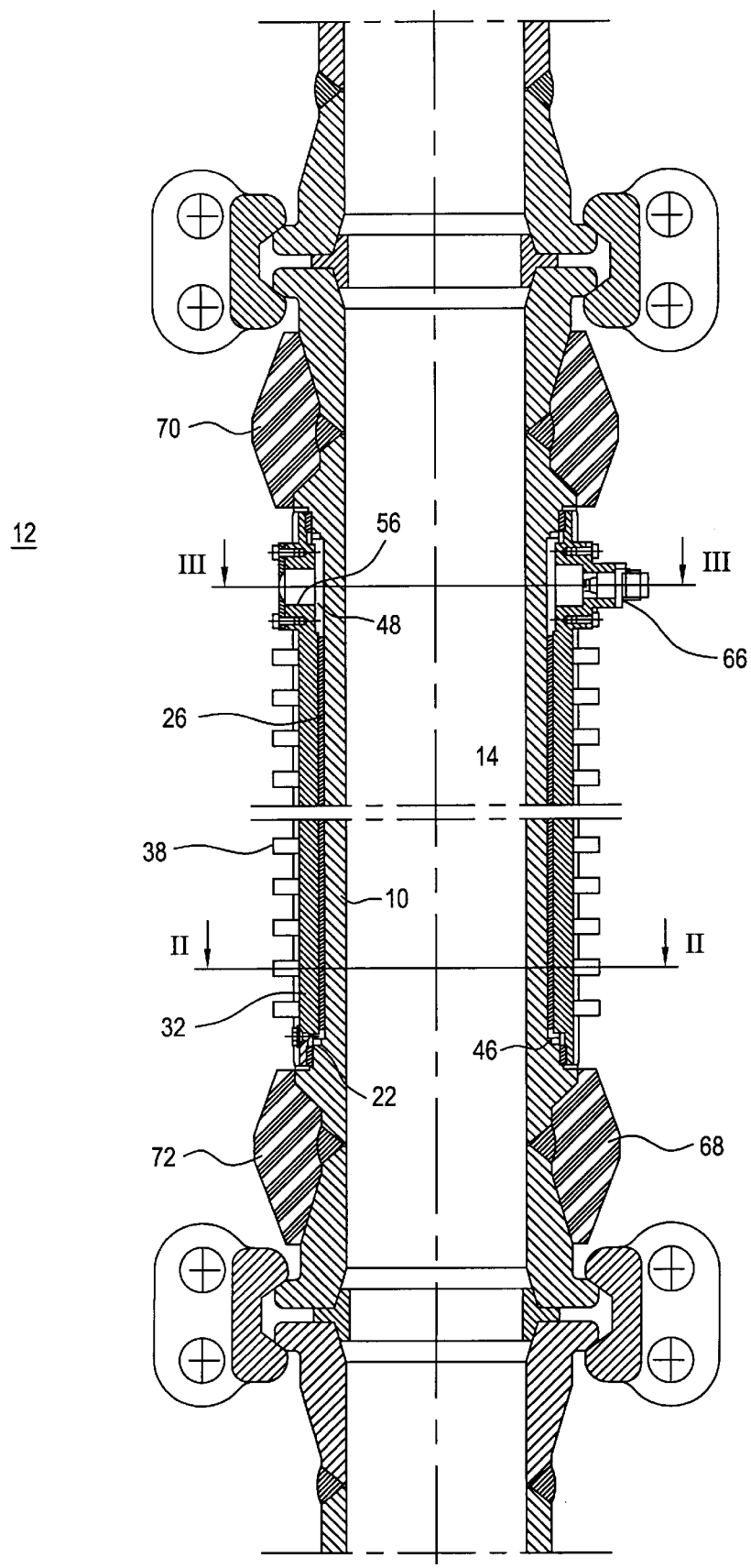
FIG. 1 is a lengthwise section through a thermoelectric generator according to one embodiment of the invention.
Figure 2:
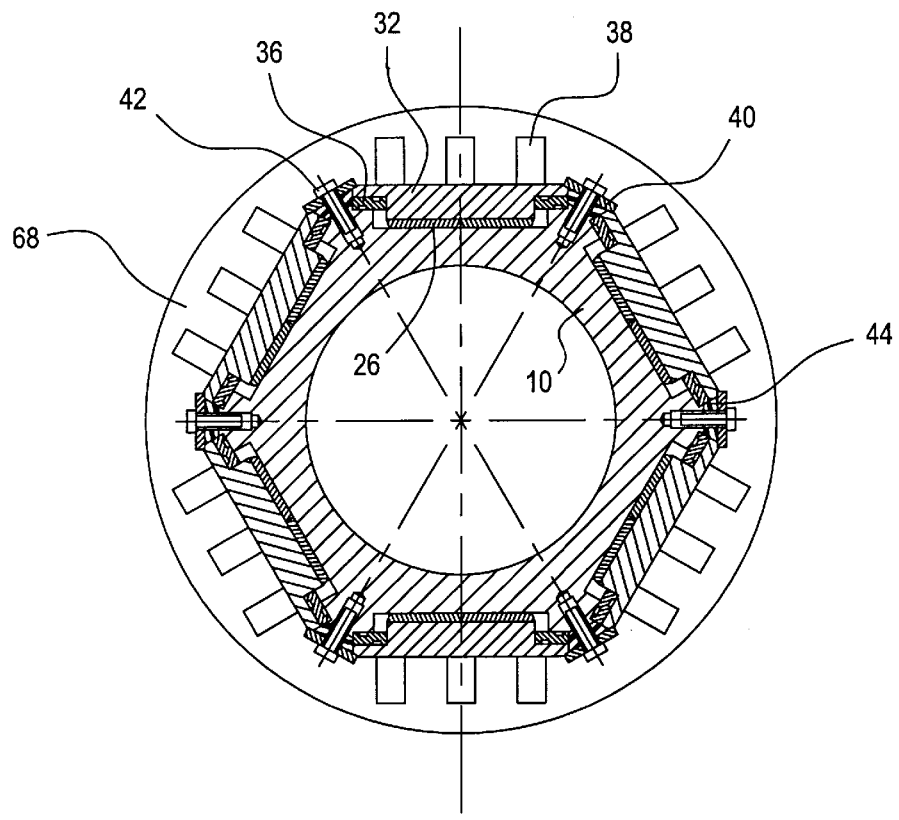
FIG. 2 is a cross section along line II—II in FIG. 1.

The thermoelectric generator shown in FIGS. 1–4 is mounted around a steel line 10 belonging to a wellhead and immersed in sea water 12. Petroleum products 14 extracted from a well circulate in the line.

A plurality of rectangular pans 16 extending in the lengthwise direction are machined into the outside wall of the line. In the case illustrated in the figures, six pans spaced radially 60° apart from each other are formed around the line. Each of the pans has a flat bottom 18 and its upper edge has a peripheral shoulder 24. The pans have transverse walls 22 and are separated from each other by lengthwise partitions 20.

A flat rectangular thermoelectric module 26 is accommodated in each pan between two sheets of heat-conducting material 28, 30 designed to improve heat exchange between the fluid carried in the line and the module, and between the module and the sea water. Module 26 and conducting sheets 28, 30 have slightly smaller dimensions than the pan bottom.

Each thermoelectric module 26 is covered by a lid 32 made of heat-conducting material resistant to the action of salt, for example copper. The lid is in the shape of a flat-bottomed rectangular plate with a larger surface area than that of a module and has a peripheral flange 34.

When the lid is installed in the pan, its lower face is applied to conducting sheet 30 and flange 34 rests on shoulder 24. A seal holder 36 made of heat-insulating material and comprised of four flat strips fitted with seals on both their faces is interposed between the flange and the shoulder. The seal holder can also be made in a single piece in the shape of a rectangular frame.

The lid is provided on its outer face with projections 38 machined from the material and designed to improve heat contact of the lid with the sea water.

The lids are held in position by flat strips 40 made of heat-insulating material, each of them overlapping the lengthwise edges of two neighboring lids. The flat strips are screwed to partitions 20 by means of bolts 42. Before the flat strips are installed, an elastomer in a paste form, 44, is applied to the gap between the edges of the lids.

Figure 3:
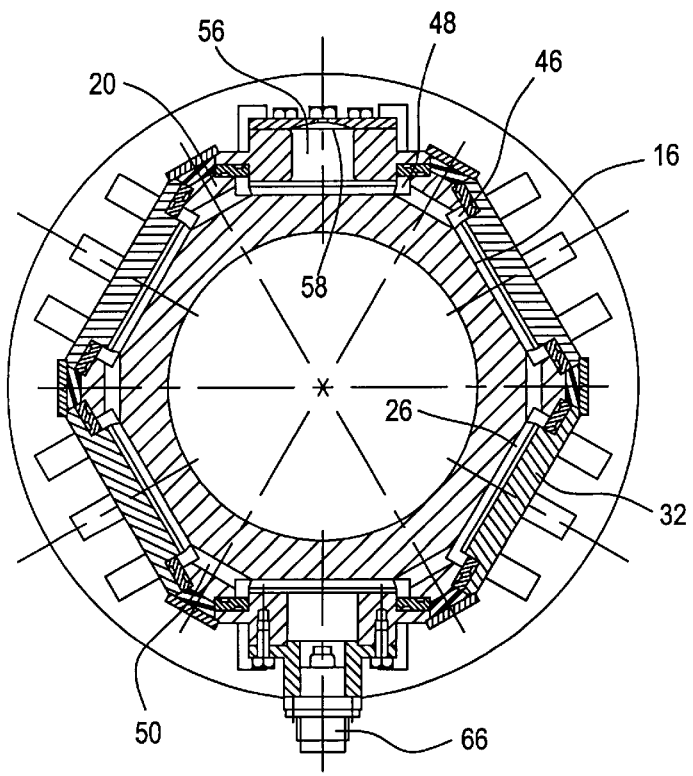
FIG. 3 is a cross section along line III—III in FIG. 1.
Figure 4:
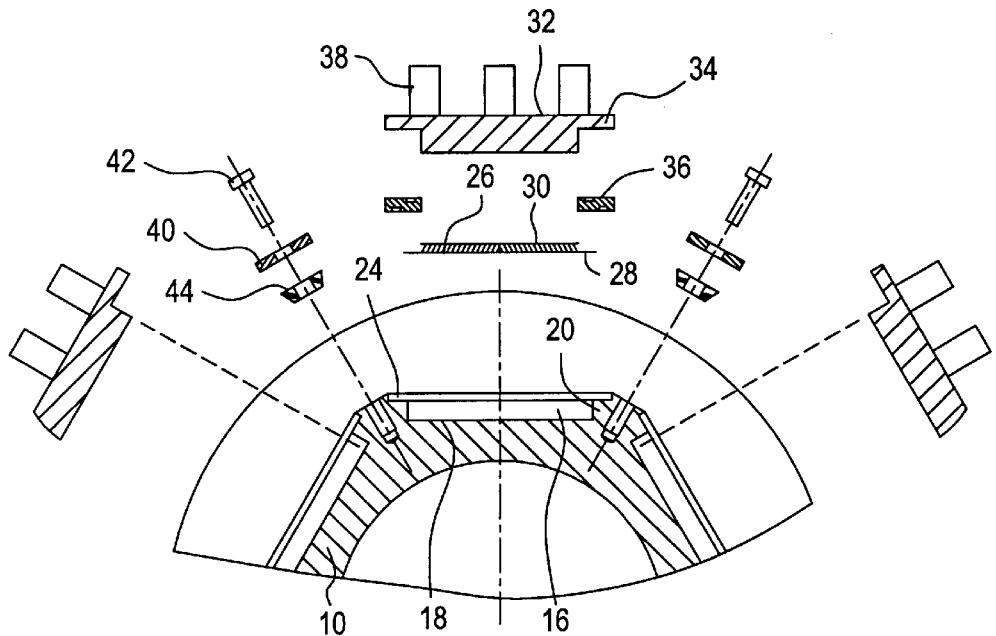
FIG. 4 is a partially exploded view of FIG. 2.
Figure 5:
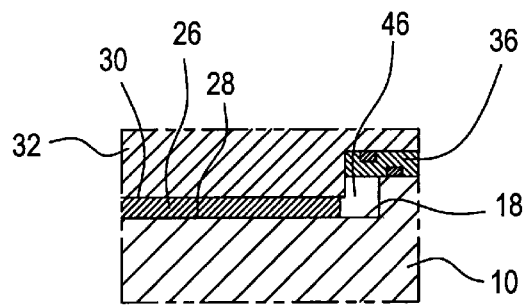
FIG. 5 is a view on a larger scale of a detail of FIG. 2.

In view of the relative dimensions of a module, a lid, and a pan, as stated hereinabove, there remains a peripheral enclosure 46 of small height and length, within each pan. As shown in FIG. 1, the enclosure terminates in a tall filling chamber 48 located under the lid at one of the ends of each pan. Moreover, as shown in FIG. 3, chambers 48 located in the various pans communicate with each other through passages 50 provided through partitions 20.

The generator according to the invention also has pressure-balancing means for compensating for the hydrostatic pressure applied by the sea water to lids 32 and hence protecting the modules against compressive forces. For this purpose, enclosures 46 and chambers 48 are filled with a soft compliant heat-insulating resin.

Figure 6:
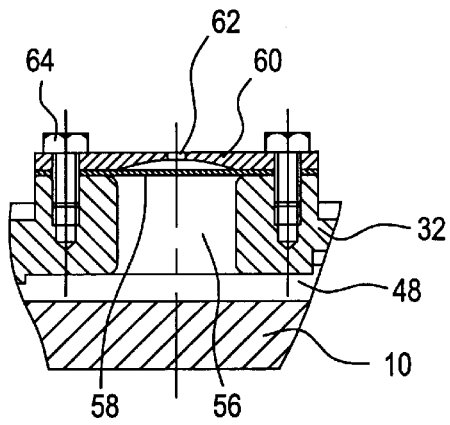
FIG. 6 is a partial view on a larger scale of a detail of FIG. 1.

The resin is added by any known method, for example, through an orifice 56 provided in one of the lids in the region thereof located above chamber 48. When filling is completed, orifice 56 is sealed by a deformable membrane 58 covered by a protective plate 60 provided at its center with a hole 62. The assembly comprised of the membrane and protective plate is attached by means of bolts 64 (FIG. 6).

The external pressure is communicated through hole 62 to membrane 58 which compresses the resin as it deforms. The resin hence applies a pressure to all the lids in the direction opposite the hydrostatic pressure of the sea water. These two pressures balance so that the thermoelectric modules undergo practically no compression.

The generator also has an electrical outlet 66 (FIG. 3) to collect the electric current produced.

Annular deflecting blocks 68, 70 made of insulating material are mounted at the ends of line 10. These blocks have frustroconical walls 72 sloping toward the lids to favor the flow of eddies formed by natural convection around lids 32 and ensure improved heat exchange between the sea water and the modules.

In conclusion, the invention provides a subsea thermoelectric generator in which heat exchange between the petroleum products transported and the sea water takes place with a minimization of losses. This exchange occurs exclusively through the modules due to the presence of the various insulating elements represented by seal holders 36, elastomer blocks 44, and strips 40. Moreover, in contrast to the generators according to the prior art, the modules undergo no mechanical stress and are protected against corrosion by the sea water barrier created by strips 40.

In a known manner, the generator can be connected in parallel with a battery so that the battery takes over for the generator if the latter loses power.

The generator can also operate by the Peltier effect, namely it can produce heat when electrical current is supplied to it. One example of application of the Peltier effect is liquefaction, under the action of heat, of the paraffin plugs deposited on the interior walls of oil pipelines. For this purpose, the thermoelectric generator according to the invention is installed around the portion of the pipeline containing the plugs. The generator can be easily installed if line 10 is made of two semicylindrical parts assembled around the pipe.

While this invention has been described in conjunction with specific embodiments thereof, it is evident that many alternatives, modifications and variations will be apparent to those skilled in the art. Accordingly, the preferred embodiments of the invention set forth herein are intended to be illustrative, not limiting. Various changes may be made without departing from the spirit and scope of the invention as defined in the following claims.

What is claimed is:

1. A thermoelectric generator for use with a conduit immersed in water, comprising:

a tubular body having an outside wall, the outside wall having concentrically located depressions, each depression having side walls, end walls and a flat bottom;

a plurality of flat thermoelectric modules disposed in the depressions located in the outside wall of the tubular body;

a plurality of lids made of heat-conducting material, each lid covering one of the depressions and in thermal contact with one of the thermoelectric modules;

partitions in the tubular body between the depressions;

compliant resin filling chambers defined by the lids, the side walls and the end walls of the depressions and by peripheral edges of the thermoelectric modules, the resin also filling passages located in the partitions and interconnecting the chambers;

at least one of the depressions being in communication with an orifice that extends between at least one depression and a deformable element that communicates with the water in which the thermoelectric generator is immersed, the deformable element allowing for transmission of a hydrostatic pressure of the water in which the thermoelectric generator is immersed to the resin.

2. The thermoelectric generator according to claim 1, wherein the deformable element includes a membrane.

3. The thermoelectric generator according to claim 2, further comprising a protective plate, the protective plate covering the membrane and having a central hole.

4. The thermoelectric generator according to claim 1, wherein the depressions are rectangular in shape, extend in a lengthwise direction of the tubular body and are separated from each other by the partitions, and the partitions extend in the lengthwise direction of the tubular body.

5. The thermoelectric generator according to claim 4, wherein each depression has a peripheral shoulder on which one of the lids rests.

6. The thermoelectric generator according to claim 5, wherein the lids are in the shape of flat-bottomed rectangular plates, each flat bottom having a same surface area as the thermoelectric modules and coming in contact therewith, and the lids have peripheral flanges which rest on the peripheral shoulders of the depressions.

7. The thermoelectric generator according to claim 6, further comprising a seal holder made of heat-insulating material and placed between the peripheral flange and the peripheral shoulder.

8. The thermoelectric generator according to claim 6, further comprising flat strips made of insulating material, wherein the lids are attached to the depressions by means of the flat strips, each strip being attached to the partition that separates two neighboring depressions and covering lengthwise edges of the two lids covering the two neighboring depressions.

9. The thermoelectric generator according to claim 8, further comprising an elastomer block in paste form interposed between each strip and the partition on which it rests.

10. The thermoelectric generator according to claim 1, wherein the thermoelectric modules are shorter and narrower than the depressions so that in each depression there is a peripheral area between the thermoelectric module, the depression, and the lid.

11. The thermoelectric generator according to claim 10, wherein, at one end of each depression, the peripheral area terminates in a taller filling chamber located under the lid.

12. The thermoelectric generator according to claim 11, wherein the passages are adjacent the filling chambers.

13. The thermoelectric generator according to claim 1, further comprising thermally conductive projections on an outer face of each lid, the projections increasing heat transfer between the lid and the water.

14. The thermoelectric generator according to claim 1, further comprising deflecting insulating blocks attached to the tubular body, the deflecting insulating blocks having frustroconical walls sloping toward the lids.

* * * * *